(12) United States Patent
Peng

(10) Patent No.: US 7,193,848 B2
(45) Date of Patent: Mar. 20, 2007

(54) PORTABLE INDUSTRIAL COMPUTER

(75) Inventor: Po-Hsuan Peng, Taipei Hsien (TW)

(73) Assignee: Mitac Technology Corp., Hsin-Chu Hsien (TW)

( * ) Notice: Subject to any disclaimer, the term of this patent is extended or adjusted under 35 U.S.C. 154(b) by 146 days.

(21) Appl. No.: 10/834,081

(22) Filed: Apr. 29, 2004

(65) Prior Publication Data

US 2005/0243512 A1 Nov. 3, 2005

(51) Int. Cl.
  *H05K 7/20* (2006.01)
  *G06F 1/20* (2006.01)
  *H05K 5/00* (2006.01)

(52) U.S. Cl. .................... 361/690; 361/687; 361/692; 361/695; 454/184; 312/236

(58) Field of Classification Search .............. 361/690, 361/687, 692, 695; 454/184; 312/236
See application file for complete search history.

(56) References Cited

U.S. PATENT DOCUMENTS

2002/0141152 A1* 10/2002 Pokhama et al. .......... 361/687
2004/0042174 A1* 3/2004 Tomioka et al. ........... 361/687
2004/0100765 A1* 5/2004 Crippen et al. ............ 361/687

* cited by examiner

*Primary Examiner*—Lisa Lea-Edmonds
*Assistant Examiner*—Zachary Pape
(74) *Attorney, Agent, or Firm*—Harness, Dickey & Pierce, P.L.C.

(57) ABSTRACT

A portable industrial computer includes a host having an aperture located on a bottom side leading to the interior of the host and a movable heat dissipation panel pivotally coupled on the aperture in a movable manner to open or close the aperture. The movable heat dissipation panel has a top end extended outside the bottom side of the host and the aperture when the movable heat panel closes the aperture so when the portable industrial computer rested on a loading object generating a reaction force towards the interior of the host to push the movable heat dissipation panel to open the aperture for dispersing heat from the interior of the host. When the portable industrial computer removed from the loading object, the movable heat dissipation panel closes the aperture to prevent water or dust from entering the interior of the host avoiding damage.

5 Claims, 2 Drawing Sheets

PORTABLE INDUSTRIAL COMPUTER

FIELD OF THE INVENTION

The present invention relates to a portable industrial computer adopted for use in industrial data processing.

BACKGROUND OF THE INVENTION

The present portable industrial computers mostly have radiation fins mounted onto the central processing unit (CPU) to absorb the heat generated by the CPU and transfer the heat through the radiation fins and a bottom metal casing of the host that has a larger area to disperse the heat. So a water-proof effect may be achieved while heat generated by the CPU may be absorbed, transferred and dispersed.

In order to improve heat dissipation speed, some portable industrial computers have air fans. The air fan generally is installed nearby the CPU to enhance heat dissipation efficiency. Being waterproof is important for the portable industrial computer. Still, openings leading to the host tend to channel water or dust into the interior of the host. This could result in malfunction or breakdown of the computer. Hence the current design is to mount the air fan outside the portable industrial computer to meet heat dissipation and waterproof requirements.

SUMMARY OF THE INVENTION

The primary loading object of the invention is to provide a portable industrial computer that has a movable heat dissipation panel to close and open an aperture located on the bottom side of the host. When the portable industrial computer is rested on a loading object, the movable heat dissipation panel opens the aperture to disperse heat from the interior of the host. When the portable industrial computer is removed from the loading object, the movable heat dissipation panel closes the aperture. Therefore heat dissipation efficiency of the portable industrial computer increases, and water or dust may be prevented from entering the host and avoid damage of the computer.

The portable industrial computer according to the invention includes a host and a movable heat dissipation panel. The host has a bottom side with an aperture formed thereon leading to the interior of the host. The movable heat dissipation panel is pivotally mounted on the aperture and can close or open the aperture. It has a top end extended outside the bottom side of the host and the aperture when the aperture is closed. Thus when the portable industrial computer rests on a loading object, the top end is in contact with the loading object, and the loading object generates a reaction force towards the interior of the host to drive the movable heat dissipation panel, to open the aperture, so that heat generated in the host may be dispersed. When the portable industrial computer is removed from the loading object, the movable heat dissipation panel closes the aperture to prevent water or dust from entering the interior of the host and avoid damage.

The portable industrial computer according to the invention can achieve the following effects:

1. The movable heat dissipation panel located on the bottom side of the portable industrial computer can improve heat dissipation efficiency.
2. A torsion spring is provided to enable the movable heat dissipation panel to open and close the aperture, and a water absorbing element is provided to absorb water seeped in the host, to avoid damping and damaging the portable industrial computer.
3. The invention is easy to install.
4. When the portable industrial computer of the invention is rested on a loading object, the top end of the movable heat dissipation panel is in contact with the loading object and the loading object generates a reaction force towards the interior of the host to open the movable heat dissipation panel. This is convenient.

The foregoing, as well as additional loading objects, features and advantages of the invention will be more readily apparent from the following detailed description, which proceeds with reference to the accompanying drawings.

DESCRIPTION OF THE PREFERRED EMBODIMENTS

Figure 1:
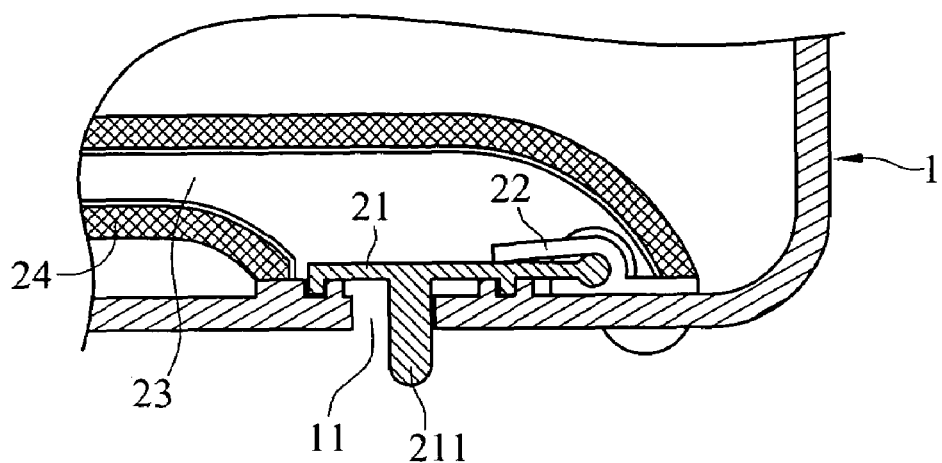
FIG. 1 is a sectional view of the invention.

Referring to FIG. 1, the portable industrial computer according to the invention includes a host 1, a movable heat dissipation panel 21, an elastic element, an air passage 23 and a water-absorbing element 24. The host 1 has an aperture 11 on the bottom side leading to the interior of the host 1.

The movable heat dissipation panel 21 is pivotally coupled on the aperture 11 at the bottom side of the host 1 and may be moved to open or close the aperture 11. When the movable heat dissipation panel 21 closes the aperture 11, its top end 211 extends outside the bottom side of the host 1 and the aperture 11. Hence when the portable industrial computer is rested on an loading object, the top end 211 is in contact with the loading object, and the loading object generates a reaction force towards the interior of the host 1 to drive the movable heat dissipation panel 21, to open the aperture 11, so that heat inside the host 1 may be dispersed.

The elastic element is located on the movable heat dissipation panel 21 to provide a force to close the aperture 21. As shown in the drawings, the elastic element is a torsion spring 22.

The air passage 23 is located in the host 1 leading to the aperture 11 so that heat inside the host 1 may be dispersed through the air passage 23.

The water absorbing element 24 is attached to the surface of the air passage 23 to prevent water from entering the interior of the host 1 when the movable heat dissipation panel 21 is opened to avoid damaging the portable industrial computer.

Figure 2A:
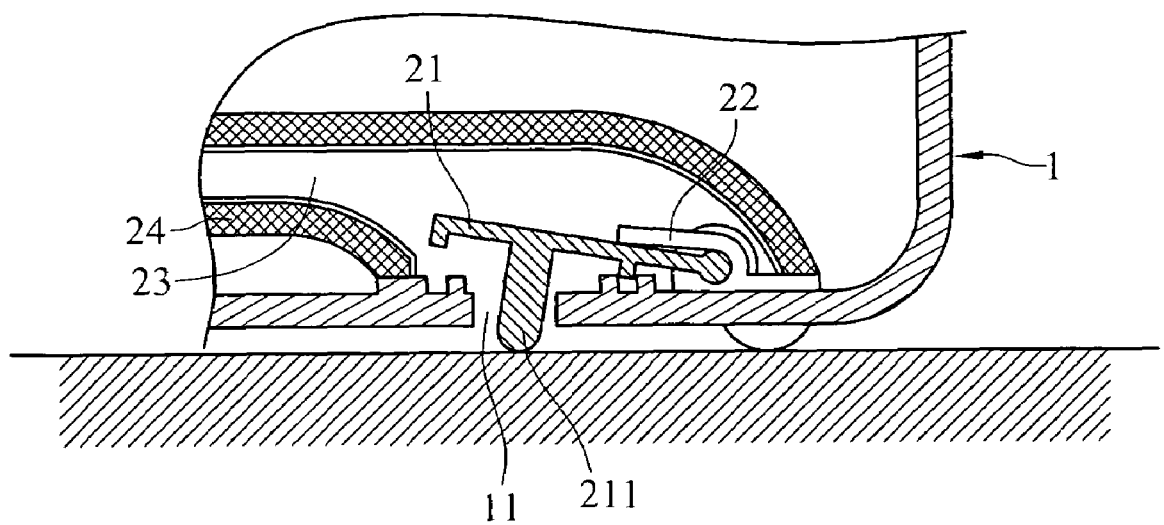
FIG. 2A is a sectional view of the invention with the heat dissipation panel opening the aperture of the host.

Referring to FIG. 2A, when the portable industrial computer is rested on an loading object, the top end 211 extended outside the bottom side of the host 1 and the aperture 11 is in contact with the loading object, and the loading object generates a reaction force towards the interior of the host 1 to drive the movable heat dissipation panel 21 and turn the torsion spring 22 and open the aperture 11, so that heat in the host 1 is dispersed through the air passage 23. And the water absorbing element 24 can prevent water from seeping into the interior of the host while the movable heat dissipation panel 21 is opened, to prevent the portable industrial computer from being damaged. Hence when the movable heat dissipation panel 21 is opened, heated air is dispersed outside through natural convection and the air passage 23. While the torsion spring 22 is turned, it stores a returning elastic force to provide a force to enable the movable heat dissipation panel 21 to close the aperture 11.

Figure 2B:
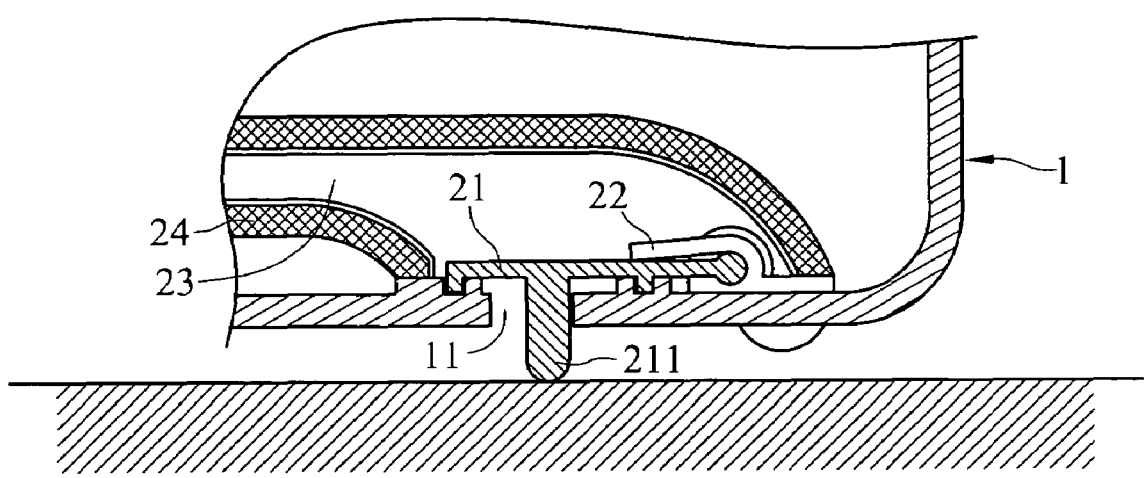
FIG. 2B is a sectional view of the invention with the heat dissipation panel closing the aperture of the host.

Referring to FIG. 2B, when the portable industrial computer is removed from the loading object, the reaction force applied on the top end 211 that originally extended outside the bottom side of the host 1 and the aperture 11 is absent. The returning force of the torsion spring 22 drives and turns the movable heat dissipation panel 21 to close the aperture 11, to prevent water from seeping into the interior of the host 1 and avoid damaging the portable industrial computer.

In order to meet the requirements of the raining test of the industrial notebook computer (by pouring water to the lateral sides of the notebook computer), the movable heat dissipation panel 21 is located on the bottom side of the host 1.

The torsion spring 22 aims to close the aperture 11 and the water absorbing element 24 aims to absorb water seeping into the interior of the host 1, thereby can prevent the portable industrial computer from being damaged.

In addition, the invention has the advantage of simple installation. Moreover, once the top end 211 is in contact with the loading object, the reaction force of the loading object directing toward the interior of the host 1 opens the movable heat dissipation panel 21. This is convenient.

Furthermore, other heat dissipation structures such as an air fan may also be installed in the portable industrial computer of the invention, to connect to the air passage 23, so that heated air may be dispersed outside the host 1 through the air passage 23, to improve heat dissipation efficiency.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A portable industrial computer, comprising:
    a host having an aperture located on a bottom side thereof leading to the interior of the host; and
    a movable heat dissipation panel pivotally and movably coupled on the aperture to open or close the aperture including a top end, which is extended outside the bottom side of the host and the aperture, when the movable heat dissipation panel opens the aperture such that when the portable industrial computer is rested on a substantially flat loading object, the top end is in contact with the loading object, and the loading object generates a reaction force towards the interior of the host to push the movable heat dissipation panel to pivotally open the aperture to disperse heat from the interior of the host.

2. The portable industrial computer of claim 1 further having an elastic element located on the movable heat dissipation panel to provide a force for the movable heat dissipation panel to close the aperture.

3. The portable industrial computer of claim 2, wherein the elastic element is a torsion spring.

4. The portable industrial computer of claim 1 further having an air passage located in the host connecting to the aperture for dispersing the heat from the interior of the host.

5. The portable industrial computer of claim 4 further having a water absorbing element which is attached to the surface of the air passage to prevent water from seeping into the interior of the host to avoid damage.

* * * * *